Figure 1:
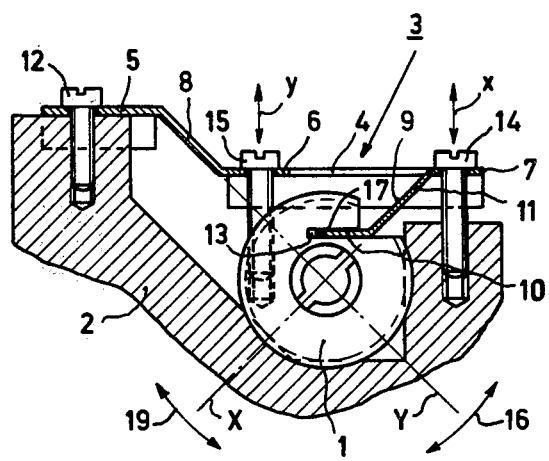

United States Patent [19]

Camerik

[11] 4,183,627
[45] Jan. 15, 1980

[54] ADJUSTING DEVICE FOR ADJUSTING THE POSITION OF AN OPTICAL OR OPTO-ELECTRONIC COMPONENT IN TWO DIRECTIONS OF ADJUSTMENT WHICH ARE PERPENDICULAR TO EACH OTHER

[75] Inventor: Eduard Camerik, Eindhoven, Netherlands

[73] Assignee: U.S. Phillips Corporation, New York, N.Y.

[21] Appl. No.: 911,211

[22] Filed: Jun. 1, 1978

[30] Foreign Application Priority Data

Feb. 27, 1978 [NL] Netherlands ..................... 7802131

[51] Int. Cl.² .................................................. G02B 7/02
[52] U.S. Cl. ........................................ 350/252; 350/247
[58] Field of Search ..................... 350/247, 255, 252; 248/1

[56] References Cited

U.S. PATENT DOCUMENTS

| | | | |
|---|---|---|---|
| 3,511,462 | 5/1970 | deBazignan et al. | 350/252 UX |
| 3,815,975 | 6/1974 | Brownscombe | 350/255 |
| 4,099,852 | 7/1978 | Kobierecki et al. | 350/255 X |

OTHER PUBLICATIONS

Adams, Jr., *IBM Technical Disclosure Bulletin*, vol. 20, No. 4, Sep. 1977, p. 1292.

*Primary Examiner*—F. L. Evans
*Attorney, Agent, or Firm*—Thomas A. Briody; William J. Streeter; Simon L. Cohen

[57] ABSTRACT

The position of an optical or opto-electronic component, such as a lens or a plate provided with a number of light-sensitive semiconductor diodes, can be adjusted in two directions of adjustment which are perpendicular to each other with the aid of an appropriate adjusting device. The adjusting device comprises two bending hinges consisting of portions of a leaf spring, which bending hinges are perpendicular to each other, the one hinge being bent relative to a stationary frame to which the adjusting device is secured and the other bending spring being bent relative to the first bending spring. The two bending springs may consist of portions of a single unit manufactured from a suitable spring material.

4 Claims, 3 Drawing Figures

ADJUSTING DEVICE FOR ADJUSTING THE POSITION OF AN OPTICAL OR OPTO-ELECTRONIC COMPONENT IN TWO DIRECTIONS OF ADJUSTMENT WHICH ARE PERPENDICULAR TO EACH OTHER

The invention relates to an adjusting device for adjusting the position of an optical or opto-electronic component, such as a lens or a plate provided with a plurality of light-sensitive semiconductor diodes, relative to a frame in two directions of adjustment which are perpendicular to each other, the component being connected to a mounting element such as a lens mount or a mounting plate.

Such adjusting devices are for example necessary in certain types of optical displayers, for example video disc players, in which a plurality of optical and opto-electronic components on a frame should be adjusted relative to each other and relative to a light source, some of them in two directions which are perpendicular to each other. In this respect it is of importance that adjustment is easy, that once the adjustment is correct it is not easily disturbed, that the adjustment is not subject to play, that hysteresis during the adjusting activities is minimal, and that the interaction between the two adjustments is minimal, i.e. that an adjustment in one direction of adjustment has no or at least little influence on the position of the component in the other direction. Furthermore, it is desirable that the adjusting device is simple and inexpensive and the adjustments can be carried out with the aid of simple tools.

It is the object of the invention to provide an adjusting device of the type mentioned in the preamble, which meets these requirements, and the invention is characterized in that the device comprises: a first leaf spring, comprising a first flat portion for fixation of the device to a frame, and parallel to the first portion a second flat portion having a free end, as well as a third portion which makes a 45° angle with and also constitutes a connection between the said first and second portions; a second leaf spring; connected to the first spring, and comprising a first portion for fixation of the mounting element to the device and having a free end, as well as a second portion which makes a 45° angle with and also constitutes a connection with the second portion of the first leaf spring and makes a 90° angle with the third portion of the first leaf spring; first fixing means for fixation of the first portion of the first leaf spring to a frame; second fixing means for fixation of the mounting element to the first position of the second leaf spring; a first set screw near the free end of the second portion of the first leaf spring for moving the second portion of the first leaf spring relative to a frame by bending of the third portion of the first leaf spring and thus moving the component in a first direction of adjustment, and a second set screw near the free end of the first portion of the second leaf spring and cooperating with the second portion of the first leaf spring for moving the free end of the first portion of the second leaf spring relative to the second portion of the first leaf spring by bending of the second portion of the second leaf spring and thus moving the component in a second direction of adjustment. The advantages of the invention evolve from the fact that the moving parts of the adjusting devices are not constituted by separate components, but are rigidly connected to other parts and cannot exhibit any play.

Preferably, an embodiment is used which is characterized in that the first and second leaf springs form an integral unit with each other. This integral unit can simply be manufactured from a suitable leaf spring material by a stamping operation. As it is of importance that the first and second portions of the first leaf spring have a higher rigidity than the bendable third portion, a further embodiment of the invention is of interest, which is characterized in that the first portion and the second portion of the first leaf spring are provided with stiffening ribs consisting of bent edges situated on both sides of the leaf spring. In order to facilitate the adjusting activities as far as possible, a further embodiment is of interest which is characterized in that the first and second set screws are parallel to each other.

Figure 2:
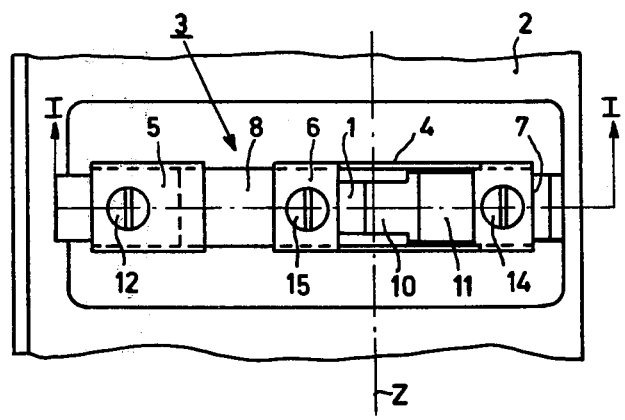
Figure 3:
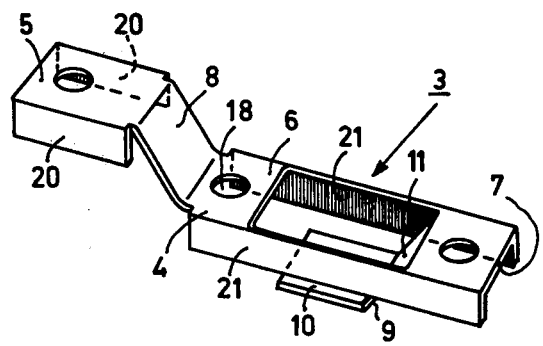

The invention will now be described in more detail with reference to the drawing which relates to an embodiment of the invention and in which:

FIG. 1 shows a cross-section of an adjusting device in accordance with the invention taken on the line I—I in FIG. 2, which device is mounted on a partly shown frame and has a lens mount secured to it, FIG. 2 is a plan view of the adjusting device of FIG. 1, and FIG. 3 is a perspective view of the unit consisting of a first and a second leaf spring.

For the sake of simplicity the lens, whose position is to be adjusted in two directions which are perpendicular to each other, is not shown. A mount 1, in which the lens can be fitted is shown. The position of the lens, and thus of the mount 1, should be adjustable in two directions which are perpendicular to each other, coinciding with two coordinate axes X and Y, which are perpendicular to each other. For this purpose an adjusting device 3 is mounted on the frame 2, to which device a mount 1 is secured. This adjusting device comprises the first flat portion 5 for the fixation to the frame 2 and a second flat portion 6 parallel to the first portion 5 and having a free end 7, as well as a third portion 8 which makes an angle of 45° with and is also the connection between said first and said second portions 5 and 6. A second leaf spring 9 is connected to the first leaf spring 4 and comprises a first portion 10 for the fixation of the mount 1, as well as a second portion 11 which makes an angle of 45° with and also constitutes a connection with a second portion 6 of the first leaf spring 4 and makes an angle of 90° with the third portion 8 of the first leaf spring 4.

A first fixing means for the fixation of the first portion 5 of the first leaf spring 4 to the frame 2 consists of a screw 12. The mount 1 is secured to the first portion 10 of the second leaf spring 9 by means, not shown. The portion 10 of the leaf spring is slid into a slot 13 and may for example be secured with the aid of a suitable type of glue or with the aid of a screw (not shown).

Adjustment of the mount 1 in the X and the Y direction is respectively effected with a first set screw 14 and a second set screw 15. The screw 14 is located near the free end 7 of the second portion 6 of the leaf spring 4 and moves said end relative to the frame in a direction which is symbolically indicated in FIG. 1 by an arrow x. This movement results in bending of the third portion 8 of the leaf spring 4. The coordinate axes shown in the FIG. 1 are respectively situated in line with the connectiong portion 8 of the first leaf spring and the connecting portion 11 of the second leaf spring. Moving the end 7 of the first leaf spring in the direction x by bending the connecting portion 8, thus results in a pivotal movement of the lens mount 1 in a pivoting direction which in FIG. 1 is indicated by the reference numeral 16, which pivotal movement, if small, may be regarded as a translation in accordance with the X-axis. A second set screw 15 near the free end 17 of the first portion 10 of the second leaf spring 9 is adapted to move the lens mount 1 in a direction y. This screw is passed through an aperture 18 of the leaf spring 4 and cooperates with screwthread in the mount 1. When the screw is tightened the first portion 10 of the second leaf spring 9 is moved relative to the second portion 6 of the first leaf spring 4 by bending of the second portion 11 of the second leaf spring 9. As a result of this, the lens mount is pivoted in a direction 19, which pivotal movement, if small, may be regarded as a translation in the direction of the Y-axis.

As is clearly shown in FIG. 3, in particular the first leaf spring 4 and the second leaf spring 9 are combined to one unit. This unit can readily be manufactured form a suitable material by means of a stamping operation. A suitable material is for example phosphor-bronze. The first portion 5 and the second portion 6 of the first leaf spring 4 are respectively provided with stiffening ribs 20 and 21 on both sides, which ribs consist of bent edges on both sides. Thus it is ensured that when the end 7 of the first leaf spring 4 is moved in the x direction virtually only the connecting portion 8 of the leaf spring is bent.

For an easy and quick adjustment of the position of the lens mount and the lens which is mounted therein, the two set screws 14 and 15 are arranged parallel to each other. The fixing screw 12 is also disposed in the same direction, so that fixation is also possible from the same direction.

What is claimed is:

1. An adjusting device for adjusting the position of an optical or opto-electronic component, such as a lens or a plate provided with a plurality of light-sensitive semiconductor diodes, relative to a frame, in two directions of adjustment (X-Y) which are perpendicular to each other, the component being connected to a mounting element, such as a lens mount or a mounting plate, the device comprising:
   a first leaf spring, comprising a first flat portion for fixation of the device to a frame, and parallel to the first portion a second flat portion having a free end, as well as a third portion which makes an angle of 45° with and also constitutes a connection between the said first and second portions,
   a second leaf spring, connected to the first leaf spring and comprising a first portion for fixation of the mounting element to the device and having a free end, as well as second portion which makes an angle of 45° with and also constitutes a connection with the second portion of the first leaf spring and makes an angle of 90° with the third portion of the first leaf spring,
   first fixing means for fixation of the first portion of the first leaf spring to a frame,
   second fixing means for fixation of the mounting element to the first portion of the second leaf spring,
   a first set screw near the free end of the second portion of the first leaf spring for moving the second portion of the first leaf spring relative to a frame by bending of the third portion of the first leaf spring and thus moving the component in a first direction of adjustment, and
   a second set screw near the free end of the first portion of the second leaf spring and cooperating with the second portion of the first leaf spring for moving the free end of the first portion of the second leaf spring relative to the second portion of the first leaf spring by bending of the second portion of the second leaf spring and thus moving the component in a second direction of adjustment, perpendicular to said first direction of adjustment.

2. An adjusting device as claimed in claim 1, wherein in that the first and second leaf springs form an integral unit with each other.

3. An adjusting device as claimed in claim 1, wherein in that the first portion and the second portion of the first leaf spring are provided with stiffening ribs consisting of bend edges situated on both sides of the leaf spring.

4. An adjusting device as claimed in claim 1, wherein in that the first and second set screws are parallel to each other.

* * * * *